US012724066B2

(12) United States Patent
Yu et al.

(10) Patent No.: US 12,724,066 B2
(45) Date of Patent: Sep. 1, 2026

(54) TEST APPARATUS WITH TEST CHAMBER FOR BURN IN BOARDS

(71) Applicant: Samsung Electronics Co., Ltd., Suwon-si (KR)

(72) Inventors: Dahm Yu, Suwon-si (KR); Dong Ho Lee, Suwon-si (KR); Seon Mi Lee, Suwon-si (KR); Hyun-Mi Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 149 days.

(21) Appl. No.: 18/917,123

(22) Filed: Oct. 16, 2024

(65) Prior Publication Data

US 2025/0277846 A1 Sep. 4, 2025

(30) Foreign Application Priority Data

Feb. 29, 2024 (KR) ........................ 10-2024-0029824

(51) Int. Cl.
*G01R 31/28* (2006.01)

(52) U.S. Cl.
CPC ..... *G01R 31/2868* (2013.01); *G01R 31/2862* (2013.01); *G01R 31/2874* (2013.01)

(58) Field of Classification Search
CPC ............ G01R 31/2868; G01R 31/2862; G01R 31/2874; G01R 31/2875; G01R 31/2855; G01R 31/2896; G01R 31/30
See application file for complete search history.

(56) References Cited

U.S. PATENT DOCUMENTS

| | | | | |
|---|---|---|---|---|
| 6,114,868 | A * | 9/2000 | Nevill | G01R 31/2874 324/750.08 |
| 11,193,970 | B2 | 12/2021 | Lee et al. | |
| 2005/0077281 | A1* | 4/2005 | Hamilton | F27B 17/00 219/393 |
| 2006/0197546 | A1* | 9/2006 | Co | G11C 29/56016 324/750.05 |
| 2021/0011070 | A1* | 1/2021 | Huang | G01R 31/003 |
| 2022/0365132 | A1* | 11/2022 | Song | G01R 31/2863 |

FOREIGN PATENT DOCUMENTS

| | | | |
|---|---|---|---|
| KR | 10-2168284 | B1 | 10/2020 |
| KR | 10-2021-0015731 | A | 2/2021 |
| KR | 10-2022-0141403 | A | 10/2022 |
| KR | 10-2023-0028954 | A | 3/2023 |
| KR | 10-2023-0064209 | A | 5/2023 |
| KR | 10-2023-0108466 | A | 7/2023 |

* cited by examiner

*Primary Examiner* — Alvaro E Fortich
(74) *Attorney, Agent, or Firm* — Fish & Richardson P.C.

(57) ABSTRACT

A test apparatus includes a test chamber; a first rack supporting a plurality of first burn in boards stacked in a first direction; a second rack on top of the first rack, and configured to support a plurality of second burn in boards stacked in the first direction; and a supply duct on a first wall in the second direction of the test chamber. The supply duct includes a first flow distributor including at least one first inclined plate overlapping the plurality of first burn in boards, and extending in an inclined manner toward a bottom of the first rack. The second flow distributor includes at least one second inclined plate spaced apart from the at least one first inclined plate in the first direction, overlapping the plurality of second burn in boards in the second direction, and extending in an inclined manner toward a bottom of the second rack.

20 Claims, 19 Drawing Sheets

TEST APPARATUS WITH TEST CHAMBER FOR BURN IN BOARDS

CROSS-REFERENCE TO RELATED APPLICATION

This application claims priority from Korean Patent Application No. 10-2024-0029824 filed on Feb. 29, 2024, in the Korean Intellectual Property Office, and all the benefits accruing therefrom under 35 U.S.C. 119, the contents of which in its entirety are herein incorporated by reference.

BACKGROUND

Various example embodiments relate to a test apparatus, and more specifically, to a test apparatus that performs a burn-in test on a semiconductor package.

A substrate or a wafer on which a specific integrated circuit is formed is divided into semiconductor chips, which are completed into a semiconductor package through an assembly process. The completed semiconductor packages are subjected to various tests and may be classified into a normal product or a defective product. Through this process, reliability of the products is maintained. The tests may include a burn in test that checks a lifespan, and/or an absence or presence of malfunction of the semiconductor package in an extreme environment outside of a normal operating condition.

In a typical burn-in test process, thermal stress is applied to the semiconductor package to be inspected by circulating high or low temperature air as an inspection fluid into a test room where the semiconductor package to be inspected is received.

Change in a flow rate of air as the inspection fluid on top of and a surrounding area around the package to be inspected in a heated state may cause change in an inspection temperature, thereby reducing accuracy of the burn-in test.

Additionally or alternatively, in order to increase test reliability, uniformity in an internal temperature of the test room should be assumed. Inside a single test room, multiple burn-in boards are arranged along a vertical direction of the test room. Thus, when the internal temperature of the test room is not uniform, different test environments are created locally in the same test room, thereby reducing the reliability of the inspection result.

Accordingly, a test chamber that may reduce deviation in the temperature and the flow rate in the test room is being pursued.

SUMMARY

A technical purpose of inventive concepts may provide a test apparatus with reduced internal temperature deviation and/or improved air flow uniformity.

Purposes according to inventive concepts are not limited to the above-mentioned purpose. Other purposes and/or advantages according to inventive concepts that are not mentioned may be understood based on following descriptions, and may be more clearly understood based on various example embodiments. Further, it may be easily understood that the purposes and advantages according to the present disclosure may be realized using means shown in the claims or combinations thereof.

According to some example embodiments, a test apparatus includes a test chamber; a first rack within the test chamber and configured to support a plurality of first burn in boards stacked in a first direction; a second rack within the test chamber and on top of the first rack, and configured to support a plurality of second burn in boards stacked in the first direction; and a supply duct on a first wall in the second direction of the test chamber, wherein the supply duct includes a first flow distributor corresponding to the first rack and a second flow distributor corresponding to the second rack, wherein the first flow distributor includes at least one first inclined plate at least partly being configured to overlap the plurality of first burn in boards in the second direction, and the at least one first inclined plate extending in an inclined manner toward a bottom of the first rack in an inner space of the supply duct, wherein the second flow distributor includes at least one second inclined plate spaced apart from the at least one first inclined plate in the first direction, the at least one second inclined plate being at least partly configured to overlap the plurality of second burn in boards in the second direction, and the at least one second inclined plate extending in an inclined manner toward a bottom of the second rack in an inner space of the supply duct.

Alternatively or additionally according to various example embodiments, a test apparatus includes a test chamber, a first rack within the test chamber and configured to support a plurality of first burn in boards stacked in a first direction, a second rack within the test chamber and on top of the first rack, and configured to support a plurality of second burn in boards stacked in the first direction, and a supply duct disposed on a first wall in the second direction of the test chamber. The supply duct includes a first flow distributor corresponding to the first rack and a second flow distributor corresponding to the second rack. The first flow distributor includes at least one first flow distribution structure, each first flow distribution structure defining a first inner space. A width in the second direction of the first inner space increases as the first inner space extends along the first direction. The second flow distributor includes a plurality of second flow distribution structures arranged along a third direction intersecting the first direction and the second direction. Each of the plurality of second flow distribution structures defines a second inner space. A width in the second direction of the second inner space increases as the second inner space extends along the first direction.

Alternatively or additionally according to various example embodiments, a test apparatus includes a test chamber, a first rack within the test chamber and configured to support a plurality of first burn in boards stacked in a first direction, a second rack within the test chamber and on top of the first rack, and configured to support a plurality of second burn in boards stacked in the first direction; and a first wall of the test chamber extending in a second direction and including or defining a plurality of inlets, and a supply duct on the first wall of the test chamber. The supply duct includes a first flow distributor corresponding to the first rack and a second flow distributor corresponding to the second rack. The test apparatus further includes a second wall of the test chamber extending in the second direction and defining a first discharge hole corresponding to the first rack and a second discharge hole corresponding to the second rack/The first flow distributor includes at least one first inclined plate. A distance between the first inclined plate and the first wall increases as the first inclined plate extends along the first direction. The second flow distributor includes a plurality of second inclined plates spaced apart from each other along a third direction intersecting the first direction and the second direction. A distance between each of the plurality of second inclined plates and the first wall increases as each of the plurality of second inclined plates extends along the first direction.

Specific details of these and other example embodiments are included in the detailed descriptions and drawings.

BRIEF DESCRIPTION OF DRAWINGS

The above and other aspects and features of inventive concepts will become more apparent by describing in detail some example embodiments thereof with reference to the attached drawings, in which.

DETAILED DESCRIPTION

Figure 1:
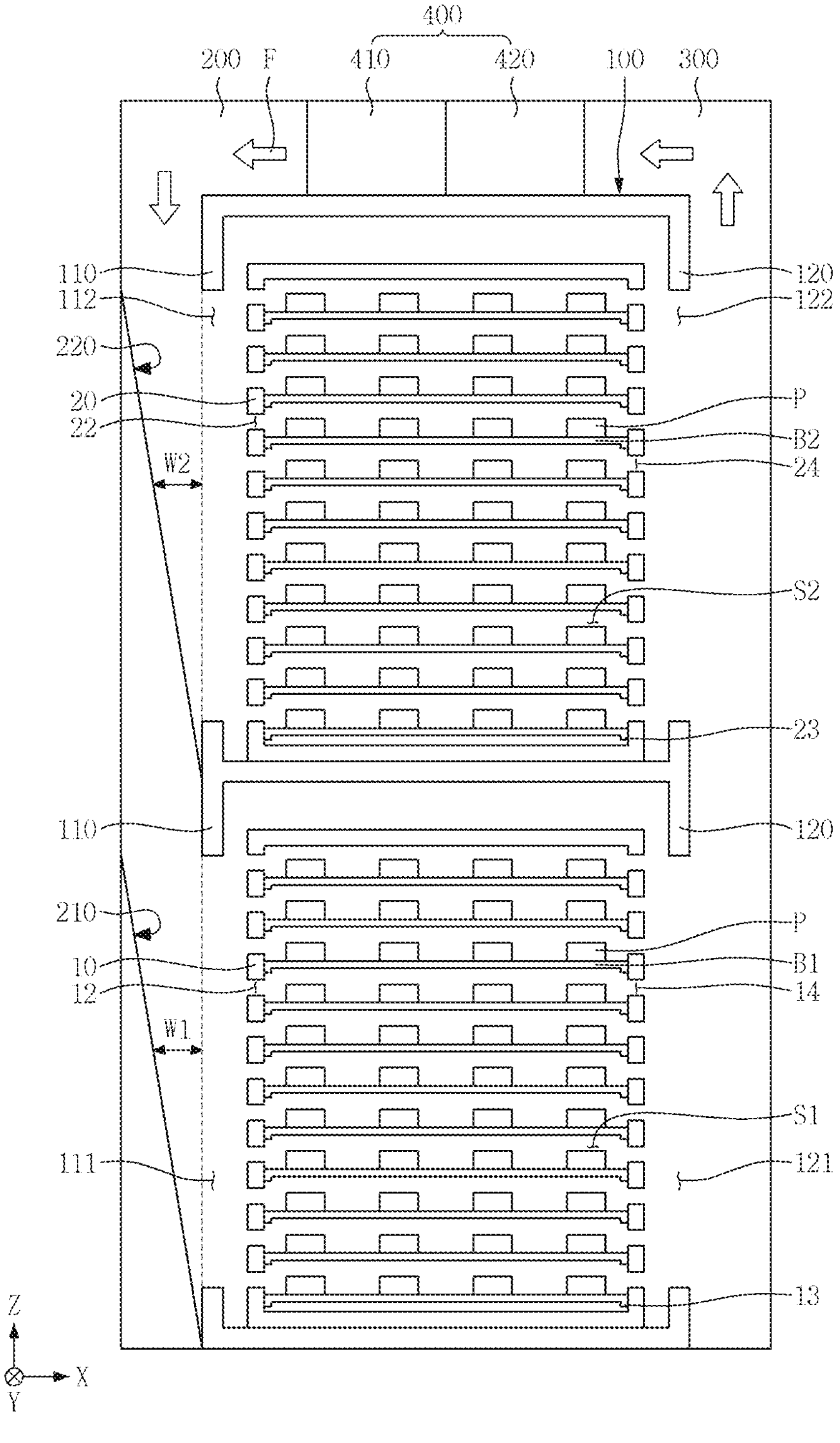
FIG. 1 is a diagram for illustrating a test apparatus according to some example embodiments.
Figure 2:
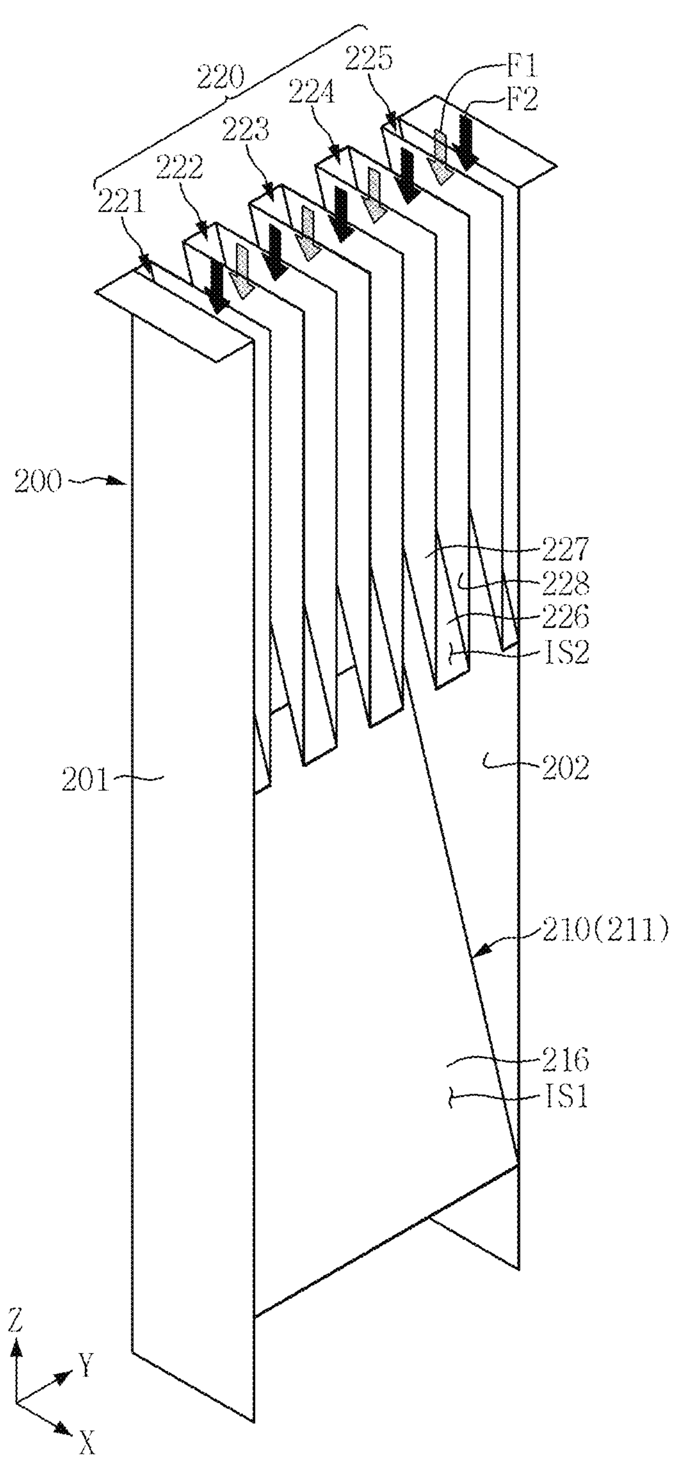
FIG. 2 is a diagram for illustrating the supply duct in FIG. 1.
Figure 3:
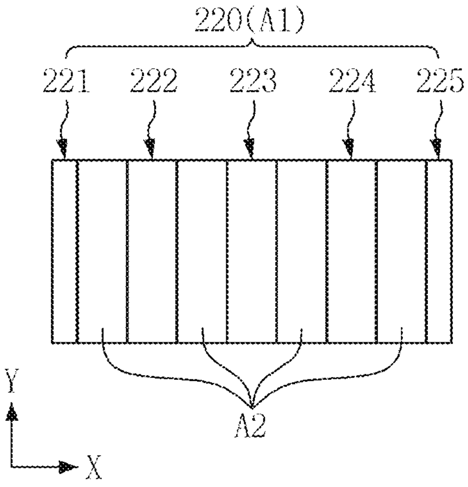
FIG. 3 is a diagram for illustrating a supply duct and a first wall in FIG. 1.
Figure 4:
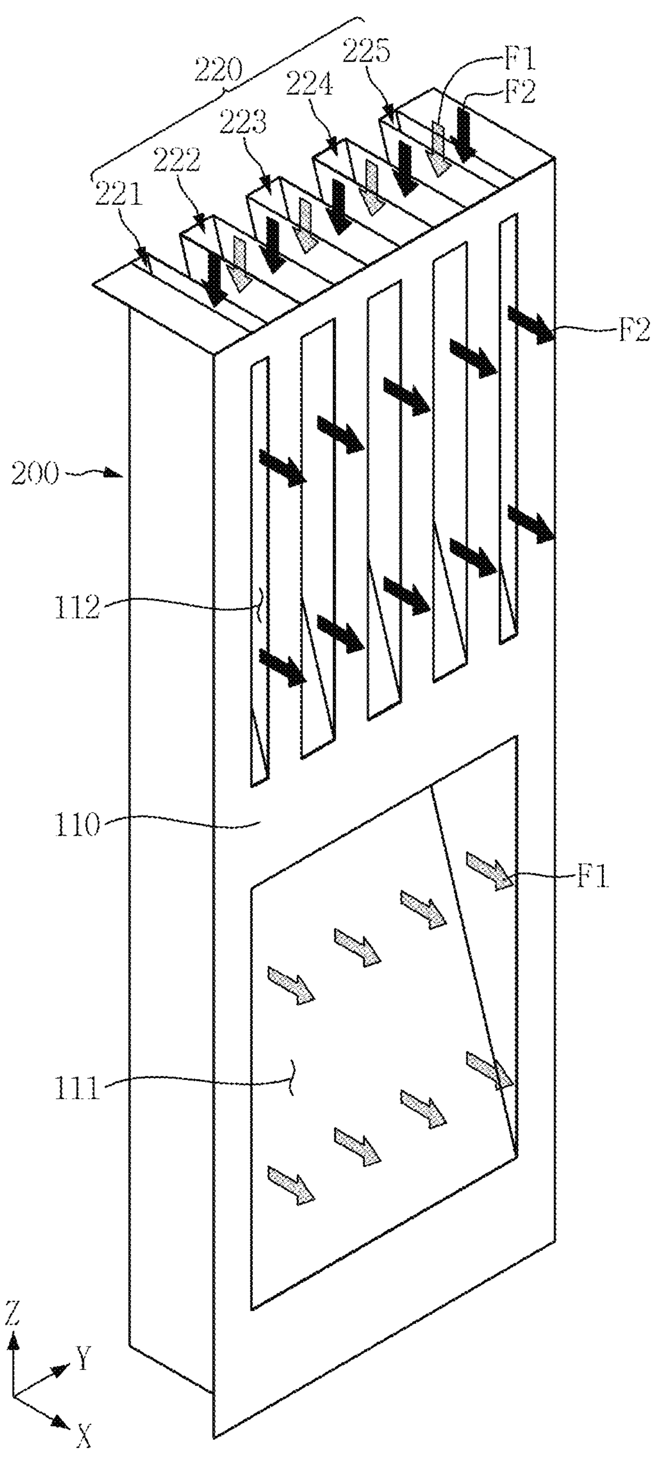
FIG. 4 is a diagram for illustrating the first wall of a test chamber in FIG. 1.

FIG. 1 is a diagram for illustrating a test apparatus according to some example embodiments. FIG. 2 is a diagram for illustrating a supply duct in FIG. 1. FIG. 3 is a diagram for illustrating the supply duct and a first wall in FIG. 1. FIG. 4 is a diagram for illustrating the first wall of a test chamber in FIG. 1. FIG. 2 is a diagram showing the supply duct and FIG. 4 is a diagram showing the supply duct and the first wall of the test chamber.

Referring to FIGS. 1 to 4, a test apparatus according to some example embodiments may include a test chamber 100, a supply duct 200, a discharge duct 300, and a circulator 400.

In some example embodiments, the test chamber 100 is provided as a burn-in test chamber for testing thermal and/or humid stress on an inspection target P. The burn-in test chamber operates in a scheme that controls a test temperature condition using heated or cooled air. The test chamber 100 may be applied to a variety of apparatus that may perform various heat damage tests at high and low temperatures on the inspection target P to test strength, stability, and/or reliability of the product.

For example, each of first and second burn in boards B1 and B2 may be composed of or may include a printed circuit board with an electronic circuit pattern printed therein. One burn in board B1 or B2 may be equipped with a plurality of fixed sockets to accommodate multiple inspection targets P at the same time. For example, the test chamber 100 accommodates therein the burn in boards B1 and B2 upon which a plurality of inspection targets P are mounted, and applies an inspection signal to the burn in boards B1 and B2.

The inspection target P may include a semiconductor package completed through a chip manufacturing process and a packaging process; however, example embodiments are not limited thereto. The inspection targets P may be arranged in a matrix manner on the test board B. There may be more or fewer inspection units arranged in the first burn in board B1 and/or the second burn in board B2. Furthermore in some examples, the inspection target P may be or may include a bare chip that has not gone through a packaging process.

The inspection target P may be inserted into a fixing socket provided on an upper surface of each of the burn in boards B and B2 and may be connected to an electronic circuit pattern inside each of the burn in boards B1 and B2. A connection terminal provided on one side of each of the burn in boards B1 and B2 and connected to the electronic circuit pattern may be inserted into a connection socket provided at one axis of a wall constituting the test chamber 100. Accordingly, the inspection signal applied to the connection socket of the test chamber 100 may be applied to the inspection target P via the connection terminal and the electronic circuit pattern.

The test chamber 100 has an inspection space defined therein. The test chamber 100 may be opened or closed by one or more doors. The first and second burn in boards B1 and B2 may be disposed in or taken out of the test chamber 100 through the door. The test apparatus performs a test on the inspection target P while the test chamber 100 is closed.

A first rack 10 and a second rack 20 is disposed in the test chamber 100. The rack 10 and 20 is disposed in the inspection space of the test chamber 100. For example, two racks 10 and 20 are stored in the test chamber 100. The following description will be based on an example that the two racks 10 and 20 are disposed in the test chamber 100. However, example embodiments are not limited thereto. Three or more racks may be disposed in the test chamber 100.

The first rack 10 supports the first burn in boards B1 stacked in the third direction Z. The first burn in board B1 is mounted on a first guide rail 13 installed in the first rack 10. The inspection target P is mounted on the first burn in board B1. A space between the first guide rails 13 adjacent to each other in the third direction Z is provided as a first slot S1 for accommodating therein the first burn in board B1. The first rack 10 includes a plurality of first slots S1, and each first burn in board B1 is accommodated in each first slot S1.

In this regard, the third direction Z is perpendicular to an upper surface of the first burn in board B1. As used herein, the terms "upper, top, lower and bottom" are defined based on the third direction Z. A first direction X and a second direction Y are directions parallel to the upper surface of the first burn in board B1. The first direction X and the second direction Y are perpendicular to the third direction Z, and the first direction X is perpendicular to the second direction Y.

The first rack 10 includes or defines a plurality of first through-holes 12 and 14. The first through-hole 12 and 14 may correspond to the first slot S1. The first through-holes 12 and 14 may correspond to a space between the first burn in boards B1 adjacent to each other in the third direction Z. The first through-hole 12 may be formed in a wall of the first rack 10 facing the supply duct 200, and the first through-hole 14 may be formed in a wall of the first rack 10 facing the discharge duct 300.

The second rack 20 is disposed on top of the first rack 10. The first rack 10 and the second rack 20 are stacked in the third direction Z. The second rack 20 supports the second burn in boards B2 stacked in the third direction Z. The second burn in board B2 may be mounted on a second guide rail 23 installed in the second rack 20. The inspection target P is mounted on the second burn in board B2. A space between the second guide rails 23 adjacent to each other in the third direction Z is provided as a second slot S2 for accommodating therein the second burn in board B2. The second rack 20 includes a plurality of second slots S2, and each second burn in board B2 is accommodated in each second slot S2.

The second rack 20 includes or defines a plurality of second through-holes 22 and 24. The second through-holes 22 and 24 may correspond to the second slot S2. The second through-holes 22 and 24 may correspond to a space between the second burn in boards B2 adjacent to each other in the third direction Z. The second through-hole 22 may be formed in a wall of the second rack 20 facing the supply duct 200, and the second through-hole 24 may be formed in a wall of the second rack 20 facing the discharge duct 300.

The test chamber 100 includes a first wall 110 and a second wall 120. The first wall 110 is opposite to the second wall 120 in the first direction X. The first wall 110 includes or defines at least one first inlet 111 and at least one second inlet 112. The first inlet 111 corresponds to the first rack 10 and the second inlet 112 corresponds to the second rack 20. In some example embodiments, the first wall 110 includes or defines one first inlet 111 and one second inlet 112. The second wall 120 includes or defines a first discharge hole 121 and a second discharge hole 122. The first discharge hole 121 corresponds to the first rack 10 and the second discharge hole 122 corresponds to the second rack 20.

The supply duct 200 is formed on the first wall 110 of the test chamber 100. The supply duct 200 is disposed to cover the first wall 110. The discharge duct 300 is formed on the second wall 120 of the test chamber 100. The discharge duct 300 is disposed to cover the second wall 120.

A first flow distributor 210 and a second flow distributor 220 are disposed within the supply duct 200. The first flow distributor 210 corresponds to the first rack 10, and the second flow distributor 220 corresponds to the second rack 20.

The first flow distributor 210 includes at least one first flow distribution structure 211. The first flow distribution structure 211 includes a first inclined plate 216. In some example embodiments, the first flow distributor 210 includes one first flow distribution structure 211 and one first inclined plate 216.

The first inclined plate 216 may extend in an inclined manner from a portion of an inner wall of the supply duct 200 corresponding to a top of the first rack 10 toward a bottom of the first rack 10. An angle of the first inclined plate 216 with respect to a plane defined by the first X and second Y direction may be between 45 degrees and 90 degrees, such as 70 degrees; however, example embodiment are not limited thereto. The first inclined plate 216 may have a negative slope relative to the third direction Z. A distance W1 between the first wall 110 of the test chamber 100 and the first inclined plate 216 may increase as the first inclined plate extends in the third direction Z. A first inner space IS1 may be defined by the first inclined plate 216 and both opposing sidewalls 201 and 202 in the second direction Y of the supply duct 200. A width W1 of the first inner space IS1 in the first direction X may increase as the first inner space extends in the third direction Z.

The first inclined plate 216 may overlap or at least partly overlap the first rack 10 in the first direction X. The first inclined plate 216 may overlap an entirety of the first inlet 111 in the first direction X. The first inclined plate 216 may overlap with the plurality of first burn in boards B1 in the first direction X.

The second flow distributor 220 is spaced apart from the first flow distributor 210 in the third direction Z. The second flow distributor 220 includes a plurality of second flow distribution structures 221, 222, 223, 224, and 225. The plurality of second flow distribution structures 221, 222, 223, 224, and 225 are arranged along the second direction Y. The plurality of second flow distribution structures 221, 222, 223, 224, and 225 are spaced apart from each other along the second direction Y. The second flow distributor 220 includes a plurality of second inclined plates 226. The dimensions of each of the second flow distribution structures 221, 222, 223, 224, and 225 may be the same as each other, or at least one may be different than other ones; example embodiments are not limited thereto.

Each of the second flow distribution structures 221, 222, 223, 224, and 225 includes each second inclined plate 226. The second inclined plate 226 may extend in an inclined manner from a portion of the inner wall of the supply duct 200 corresponding a top of the second rack 20 toward a bottom of the second rack 20. The second inclined plate 226 may overlap or at least partly overlap the second rack 20 in the first direction X. The second inclined plate 226 may have a negative slope relative to the third direction Z. A distance W2 between the first wall 110 and the second inclined plate 226 of the test chamber 100 may increase as the second inclined plate extends in the third direction Z.

Each of the second flow distribution structures 221, 222, 223, 224, and 225 may define a second inner space IS2. For example, the second flow distribution structure 224 may include each second inclined plate 226 and first and second sidewalls 227 and 228 respectively disposed on both opposing sides in the second direction Y of the second inclined plate 226. A width W2 in the first direction X of each of the first and second sidewalls 227 and 228 may increase as each of the first and second sidewalls 227 and 228 extends in the third direction Z. An end in the first direction X of each of the first and second sidewalls 227 and 228 may be aligned with an end in the first direction X of the supply duct 200. The second inner space IS2 may be defined by the second inclined plate 226 and the first and second sidewalls 227 and 228. A second inner space IS2 may be defined by a side wall of each of the second flow distribution structures 221 and 225 in contact with the supply duct 200, the second inclined plate 226, and one sidewall of the supply duct 200. For example, the second flow distribution structure 221 may include the second inclined plate 226, the sidewall 201 of the supply duct 200, and the second sidewall 228 defining the second inner space IS2. The second flow distribution structure 225 may include the second inclined plate 226, the sidewall 202 of the supply duct 200, and the first sidewall 227 defining the second inner space IS2. A width W2 in the first direction X of the second inner space IS2 may increase as it extends in the third direction Z.

The second inclined plate 226 may overlap or at least partly overlap the second rack 20 in the first direction X. The second inclined plate 226 may overlap an entirety of the second inlet 112 in the first direction X. The second inclined plate 226 may overlap or at least partly overlap with the plurality of second burn in boards B2 in the first direction X. The second inclined plate 226 may overlap or at least partly overlap the first inclined plate 216 in the third direction Z. The second inclined plate 226 may be spaced apart from the first inclined plate 216 in the third direction Z.

In a plan view including the first direction X and the second direction Y, an area size A1 of a first area where the second flow distributor 220 is formed may be different from an area size A2 of a second area where the second flow distributor 220 is not formed. The area size A1 of the first area where the second flow distributor 220 is formed may be smaller than the area size A2 of the second area where the second flow distributor 220 is not formed.

In some example embodiments, the first wall 110 includes one first inlet 111 and a plurality of second inlets 112 defined therethrough.

The first inlet 111 may correspond to the first flow distribution structure 211. For example, the first inlet 111 may correspond to an opening of the first flow distribution structure 211 in a plane including the second direction Y and the third direction Z. Air F1 provided to the first flow distribution structure 211 may be provided to the first rack 10 through the first inlet 111. The air F1 may be provided from a fan (not shown) and/or a heater (not shown); example embodiments are not limited thereto.

The second inlets 112 may be spaced apart from each other along the second direction Y. The second inlets 112 may be arranged along the second direction Y. Each of the second inlets 112 may correspond to the second flow distribution structures 221, 222, 223, 224, and 225, respectively. For example, the second inlets 112 may respectively communicate with openings of the second flow distribution structures 221, 222, 223, 224 and 225 in a plane including the second direction Y and the third direction Z. Air F2 provided to each of the second flow distribution structures 221, 222, 223, 224, and 225 may be provided to the second rack 20 through each of the second inlets 112. The air F2 may be provided from a fan (not shown) and/or a heater (not shown); example embodiments are not limited thereto.

The second wall 120 may include the first discharge hole 121 and the second discharge hole 122 defined therethrough. The first discharge hole 121 may correspond to the first rack 10. The first discharge hole 121 may expose an entirety of the first through-hole 14 of the first rack 10. The second discharge hole 122 may correspond to the second rack 20. The second discharge hole 122 may expose an entirety of the second through-hole 24 of the second rack 20. Therefore, flow of air F provided from the first and second racks 10 and 20 to the discharge duct 300 may be smooth.

Air F supplied to the supply duct 200 may be provided to the test chamber 100 through the first and second inlets 111 and 112 of the first wall 110. The air F may be discharged out of the test chamber 100 through the first and second discharge holes 121 and 122 of the second wall 120. The air F is collected into the discharge duct 300 and then is supplied back to the circulator 400. Accordingly, a circulation path of the air F may extend along the supply duct 200, the test chamber 100, the discharge duct 300, and the circulator 400.

The circulator 400 may be disposed on top of the test chamber 100. The circulator 400 may be connected to the supply duct 200 and the discharge duct 300 and may circulate the air F toward the supply duct 200, the test chamber 100, and the discharge duct 300. For example, the circulator 400 may include a temperature controller 410 that controls a temperature of the air F so as to have an appropriate temperature according to a burn-in test process, and a blower 420 that enables the air F to flow to the supply duct 200.

The temperature controller 410 may be disposed on top of the test chamber 100. The temperature controller 410 may control the temperature of the air supplied to the test chamber 100. The temperature controller 410 may be composed of or may include various heating and cooling apparatuses. The temperature controller 410 may be configured, for example, as a heater connected to an external power source to heat the air F and a cooler that cools the air F using an appropriate refrigerant. Accordingly, the air F having a temperature within a certain range is supplied to the supply duct 200.

The blower 420 is disposed on top of the test chamber 100. The blower 420 drives the air F discharged from the temperature controller 410 to flow toward the supply duct 200. For example, the blower 420 may be embodied as an air blower that blows the air F toward the supply duct 200.

The air F is discharged to the discharge duct 300 via the test chamber 100. The air F flows toward the discharge duct 300 while performing a burn-in test on the inspection target P via heat exchange with the inspection target P. The air F is collected through the discharge duct 300 and then is supplied back to the circulator 400. While the air F flows through the circulator 400, the temperature of the air may be controlled by the temperature controller 410 to be an appropriate temperature for the burn-in test. When the temperature of the air F is maintained at the appropriate temperature for the test, the temperature controller 410 may not operate. The temperature controller 410 may act as a thermostat; example embodiments are not limited thereto.

The discharge duct 300 may further include a driving member capable of sucking the air F collected in the discharge duct 300 in order to provide the air F collected in the discharge duct 300 to the circulator 400. For example, the discharge duct 300 may be equipped with a vacuum pressure generator capable of applying vacuum pressure. The vacuum pressure generator may be a vacuum pump; example embodiments are not limited thereto.

The test apparatus according to some example embodiments includes the first flow distributor 210 corresponding to the first rack 10 and the second flow distributor 220 corresponding to the second rack 20 inside the supply duct 200.

The first flow distributor 210 and the second flow distributor 220 are configured to allow the air F to be uniformly or more uniformly supplied to the first rack 10 and the second rack 20, respectively. The first flow distributor 210 controls a flow rate of the air F1 so that a flow rate distribution of the air F1 along the third direction Z is uniform in an area corresponding to the first rack 10. The second flow distributor 220 controls a flow rate of the air F so that a flow rate distribution of the air F2 along the third direction Z is uniform in the area corresponding to the second rack 20. Therefore, the flow uniformity of the air F1 provided to the first rack 10 by the first flow distributor 210 may be improved and/or increased, and the flow uniformity of the air F2 provided to the second rack 20 by the second flow distributor 220 may be improved and/or increased.

Additionally or alternatively, in the test apparatus according to some example embodiments, the second flow distributor 220 includes the plurality of second flow distribution structures 221, 222, 223, 224, and 225 arranged to be spaced apart from each other in the second direction Y. The second flow distribution structures 221, 222, 223, 224, and 225 may guide a portion F1 of the air F provided to the second flow distributor 220 to the first rack 10, and may guide the remaining portion F2 thereof to the second rack 20. In some examples, a flow path of the air F1 supplied to the first rack 10 and a flow path of the air F2 supplied to the second rack 20 may be separated from each other. In a plan view including the first direction X and the second direction Y, at least one of the area size A1 of the first area where the second flow distribution structures 221, 222, 223, 224 and 225 are formed, a spacing between adjacent ones of the second flow distribution structures 221, 222, 223, 224 and 225 and/or the number of the second flow distribution structures 221, 222, 223, 224, and 225 may be adjusted such that the flow rate of the air F1 provided to the first rack 10 and the flow rate of the air F2 provided to the second rack 20 may be controlled. In some examples, a ratio of the flow rate of the air F1 provided to the first rack 10 and the flow rate of the air F2 provided to the second rack 20 may be optimized or improved.

Accordingly, inside the test chamber 100, differences between temperatures of the first slots S1 arranged in the third direction Z and differences between temperatures of the second slots S2 arranged in the third direction Z may be reduced, and a temperature variation within a single slot S1 or S2 may be reduced. In some examples, a uniform or more uniform thermal atmosphere may be created within the test chamber 100.

Additionally or alternatively, the flow of the air F supplied from the circulator 400 may be uneven. In this case, in a plan view including the first direction X and the second direction Y, at least one of the area size A1 of the first area where the second flow distribution structure 221, 222, 223, 224 and 225 are formed, the spacing between adjacent ones of the second flow distribution structures 221, 222, 223, 224 and 225 and the number of the second flow distribution structures 221, 222, 223, 224, and 225 may be controlled such that the flow of the air F may be uniform. For example, as the flow of the air F supplied from the circulator 400 the more uneven, the spacing between the adjacent ones of the second flow distribution structures 221, 222, 223, 224 and 225 may be smaller.

A portion of the air F provided from the supply duct 200, a portion F1 may be provided to the first slot S1 through the first inlet 111 and the first through-hole 12, and the remainder F2 thereof may be provided to the second slot S2 through the second inlet 112 and the second through-hole 22.

FIGS. 5 to 8 are diagrams for illustrating the second inclined plate in FIG. 2. Hereinafter, the second flow distribution structure 221 is described by way of example. However, the description of the second flow distribution structure 221 may be equally applied to each of the second flow distribution structures 222, 223, 224, and 225. Shapes of the second inclined plates 226 of the second flow distribution structures 221, 222, 223, 224, and 225 may be the same as or different from each other.

Referring to FIGS. 5 to 8, the second inclined plate 226 may have various shapes such that the flow rate distribution of the air (A in FIG. 1) along the third direction Z in the second rack (20 in FIG. 1) is uniform.

Figure 5:
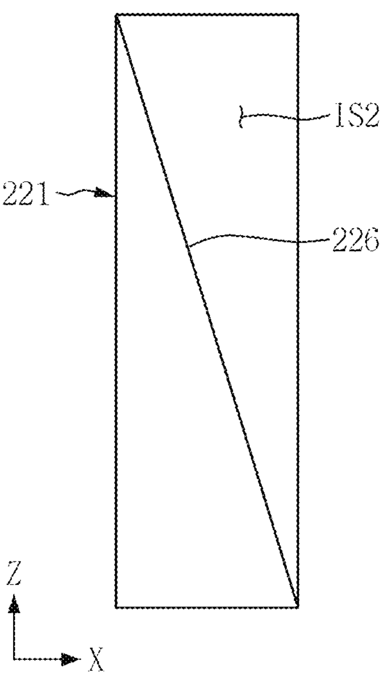
FIGS. 5 to 8 are diagrams for illustrating a second inclined plate in FIG. 2.

Referring to FIG. 5, in some example embodiments, the second inclined plate 226 has a straight line shape. A surface of the second inclined plate 226 may have a straight shape.

Figure 6:
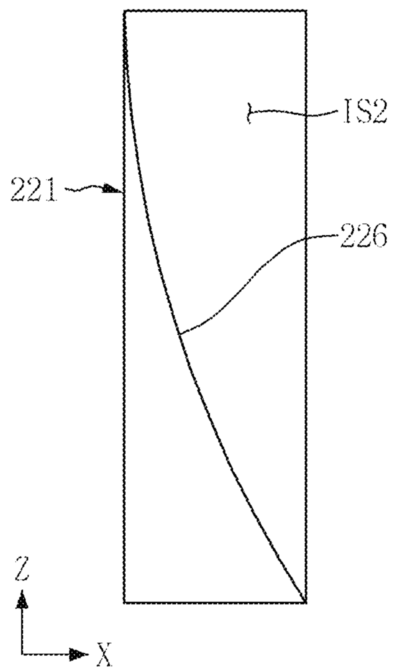
Figure 7:
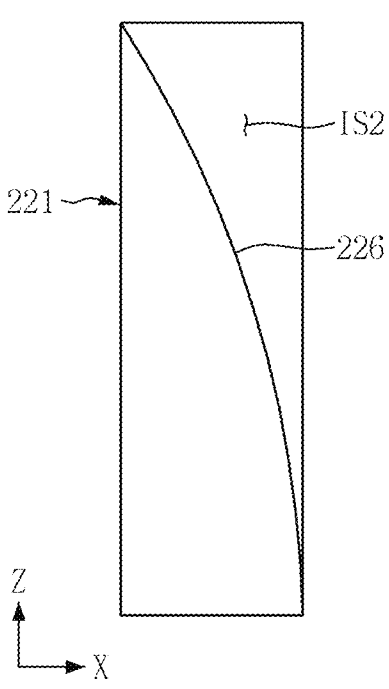

Referring to FIG. 6 and FIG. 7, in some example embodiments, the second inclined plate 226 has a curved shape. The surface of the second inclined plate 226 may have a curved shape.

Referring to FIG. 6, in some example embodiments, the second inclined plate 226 has a concave shape. The second inclined plate 226 may be convex toward a direction opposite to the third direction Z. In some cases, the concave shape may have a profile of a parabola, which in some instances may be easy to manufacture; example embodiments are not limited thereto.

Referring to FIG. 7, in some example embodiments, the second inclined plate 226 has a convex shape. The second inclined plate 226 may be convex in the third direction Z. In some cases, the convex shape may have a profile of a parabola, which in some instances may be easy to manufacture; example embodiments are not limited thereto.

Figure 8:
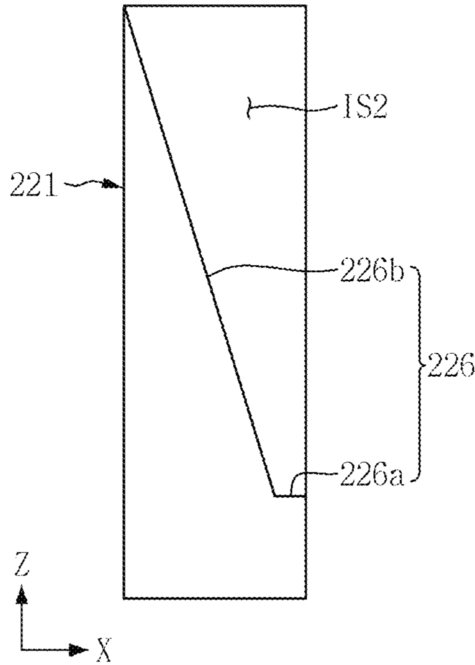

Referring to FIG. 8, in some example embodiments, the second inclined plate 226 includes a first sub-inclined plate 226*a* and a second sub-inclined plate 226*b* having different inclinations. The first sub-inclined plate 226*a* may be formed at a lower end of the second sub-inclined plate 226*b*. The second sub-inclined plate 226*b* may have a negative slope with respect to the third direction Z. The first sub-inclined plate 226*a* may extend from the lower end of the second sub-inclined plate 226*b* in the first direction X. The first sub-inclined plate 226*a* extending from the lower end of the second sub-inclined plate 226*b* in the first direction X may be formed to prevent the air guided into the second inner space IS2 from flowing downwards.

FIGS. 9 to 12 are diagrams for illustrating the first inclined plate in FIG. 2.

Referring to FIGS. 9 to 12, the first inclined plate 216 has various shapes so that the flow rate distribution of air (A in FIG. 1) along the third direction Z in the first rack (10 in FIG. 1) is uniform.

Figure 9:
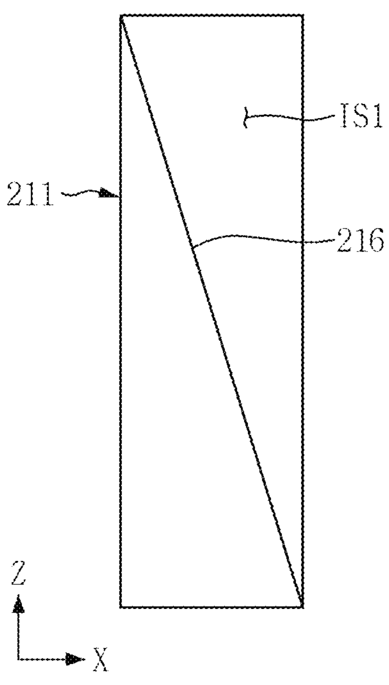
FIGS. 9 to 12 are diagrams for illustrating a first inclined plate in FIG. 2.

Referring to FIG. 9, in some example embodiments, the first inclined plate 216 has a straight line shape. A surface of the first inclined plate 216 may have a straight shape.

Figure 10:
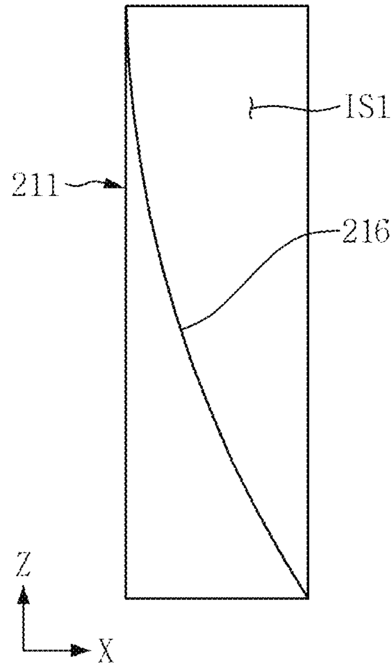
Figure 11:
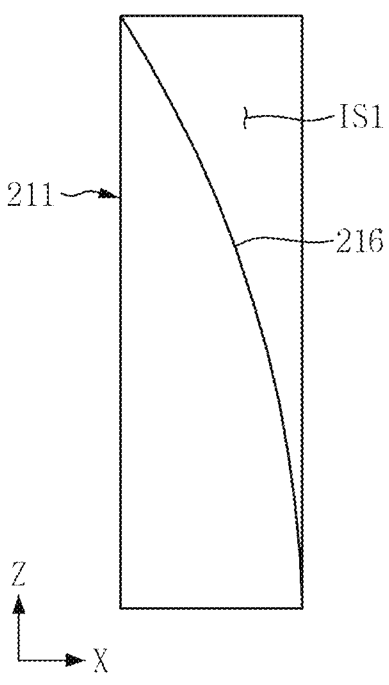

Referring to FIG. 10 and FIG. 11, in some example embodiments, the first inclined plate 216 has a curved shape. The surface of the first inclined plate 216 may have a curved shape.

Referring to FIG. 10, in some example embodiments, the first inclined plate 216 has a concave shape. The first inclined plate 216 may be convex toward a direction opposite to the third direction Z.

Referring to FIG. 11, in some example embodiments, the first inclined plate 216 has a convex shape. The second inclined plate 226 may be convex in the third direction Z.

Figure 12:
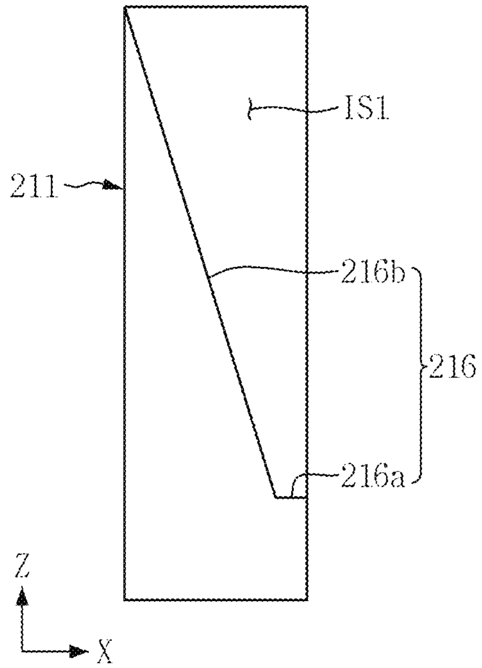

Referring to FIG. 12, in some example embodiments, the first inclined plate 216 includes a third sub-inclined plate 216*a* and a fourth sub-inclined plate 216*b* having different inclinations. The third sub-inclined plate 216*a* may be formed at a lower end of the fourth sub-inclined plate 216*b*. The fourth sub-inclined plate 216*b* may have a negative slope with respect to the third direction Z, and the third sub-inclined plate 216*a* may extend from the lower end of the fourth sub-inclined plate 216*b* in the first direction X. The third sub-inclined plate 216*a* extending in the first direction X from the lower end of the fourth sub-inclined plate 216*b* may be formed to prevent the air guided into the first inner space IS1 from flowing downwards.

Example embodiments as above are not necessarily mutually exclusive with one another. For example, in some cases some example embodiments may include one or more features described above with reference to one or more of the figures, and may also include one or more other features described above with reference to one or more of the other figures.

Figure 13:
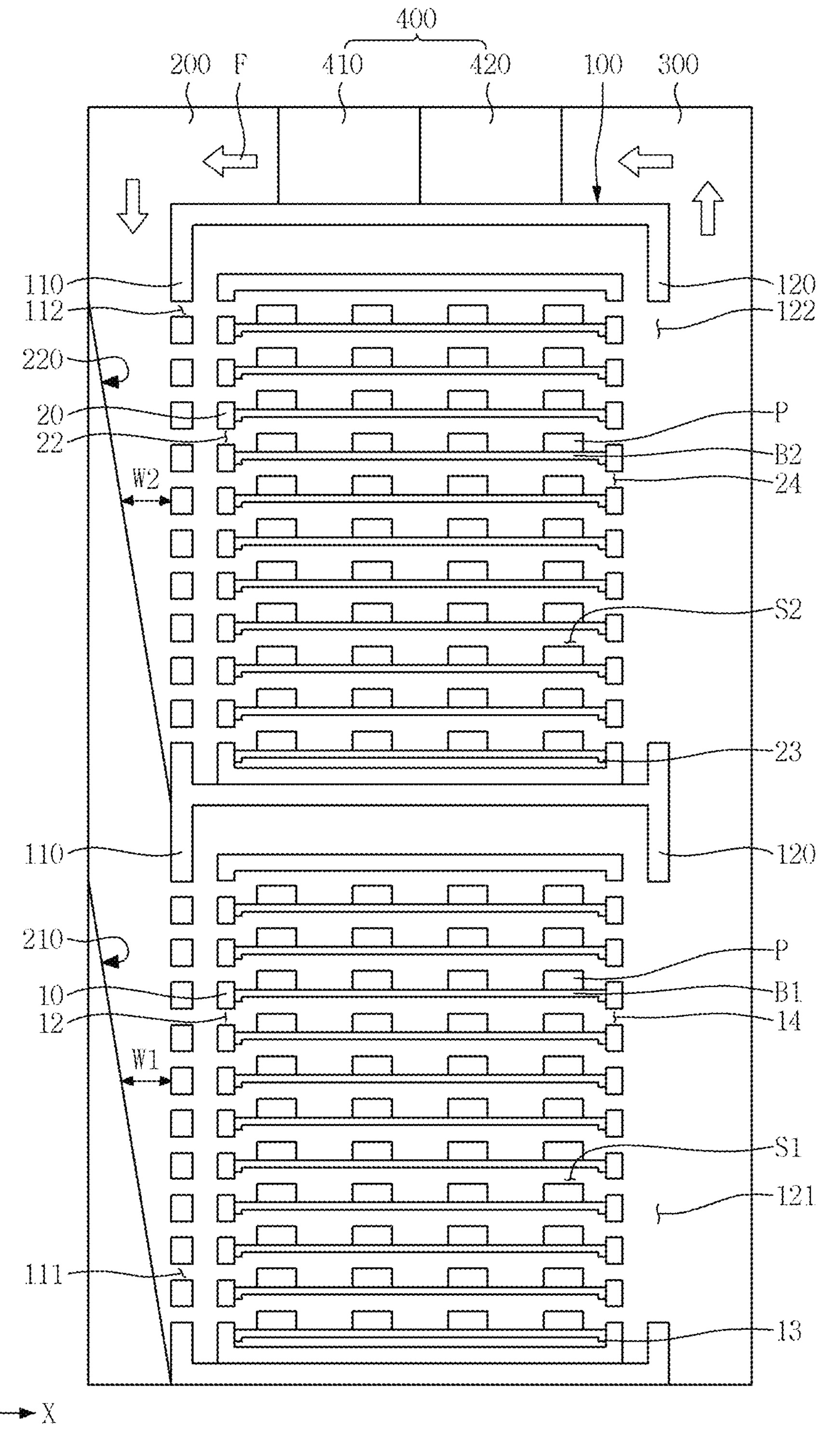
FIG. 13 is a diagram for illustrating a test apparatus according to some example embodiments.
Figure 14:
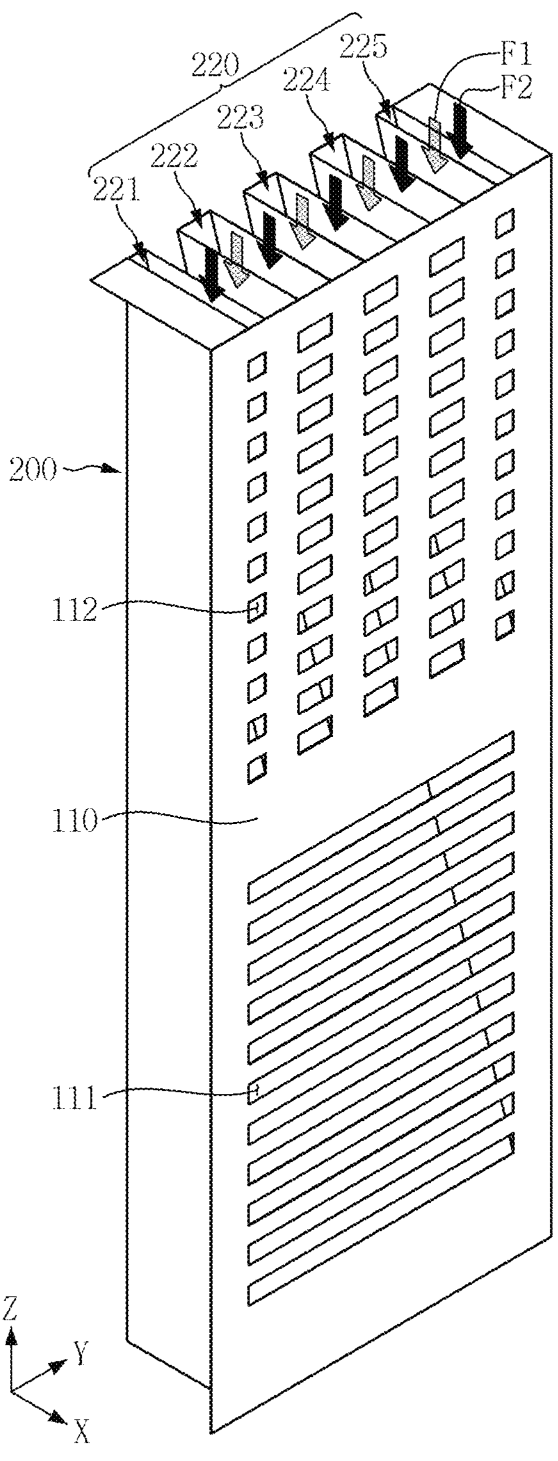
FIG. 14 is a diagram for illustrating a supply duct and a first wall in FIG. 13.
Figure 15:
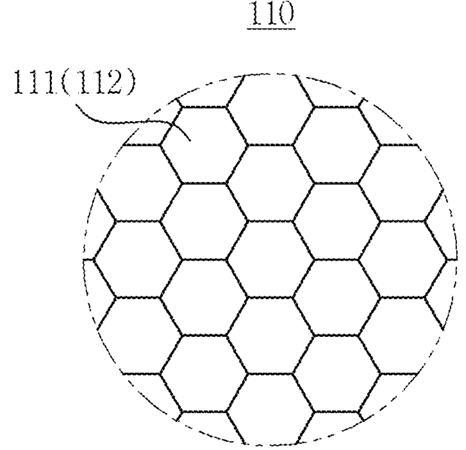
FIG. 15 is a diagram for illustrating the first wall in FIG. 13.

FIG. 13 is a diagram for illustrating a test apparatus according to some example embodiments. FIG. 14 is a diagram for illustrating a supply duct and a first wall in FIG. 13. FIG. 15 is a diagram for illustrating the first wall in FIG. 13. For convenience of description, following descriptions are based on differences thereof from the descriptions as set forth above using FIG. 1 to FIG. 12.

Referring to FIGS. 13 to 15, in the test apparatus according to some example embodiments, the first wall 110 includes a plurality of first inlets 111 and a plurality of second inlets 112.

Referring to FIG. 13 and FIG. 14, in the test apparatus according to some example embodiments, the plurality of first inlets 111 may be arranged to be spaced apart from each other along the third direction Z. Each first inlet 111 may correspond to each first slot S1. Each first inlet 111 may correspond to a space between the first burn in boards B1 adjacent to each other in the third direction Z.

The plurality of second inlets 112 may be arranged in the second direction Y and the third direction Z. Each of the second inlets 112 arranged along the third direction Z may correspond to each second slot S2. Each second inlet 112 may correspond to a space between the second burn in boards B2 adjacent to each other in the third direction Z.

Referring to FIG. 15, in the test apparatus according to some example embodiments, the first inlets 111 and/or the second inlets 112 of the first wall 110 may be arranged in a honeycomb structure, e.g. a hexagonal such as a regular hexagonal structure. For example, the first inlets 111 may be arranged in a honeycomb structure, and the second inlets 112 may be arranged in a honeycomb structure. Each of the first inlet 111 and the second inlet 112 may have a hexagonal shape. The first inlets 111 may be arranged in the first direction X and the second direction Y. The second inlets 112 may be arranged in the first direction X and the second direction Y.

Figure 16:
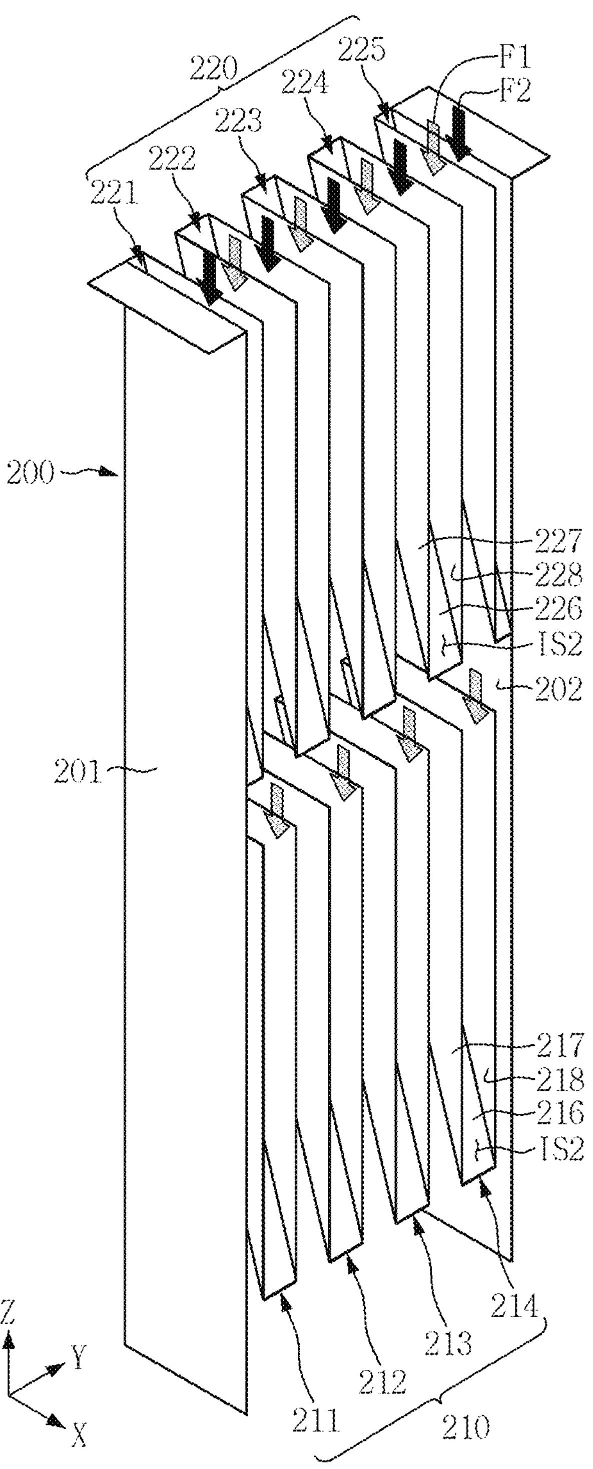
FIG. 16 is a diagram for illustrating a supply duct in FIG. 1.
Figure 17:
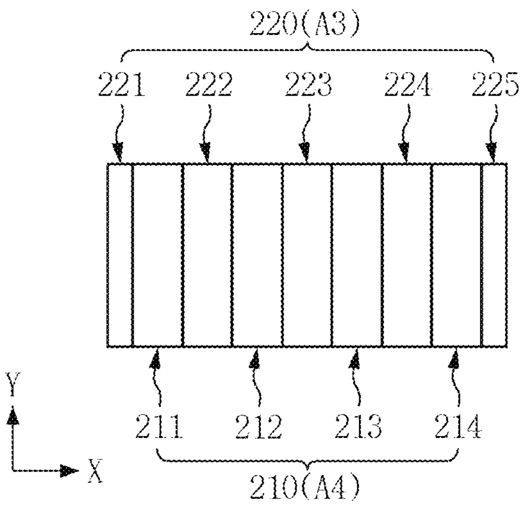
FIG. 17 is a diagram for illustrating the supply duct and the first wall in FIG. 1.
Figure 18:
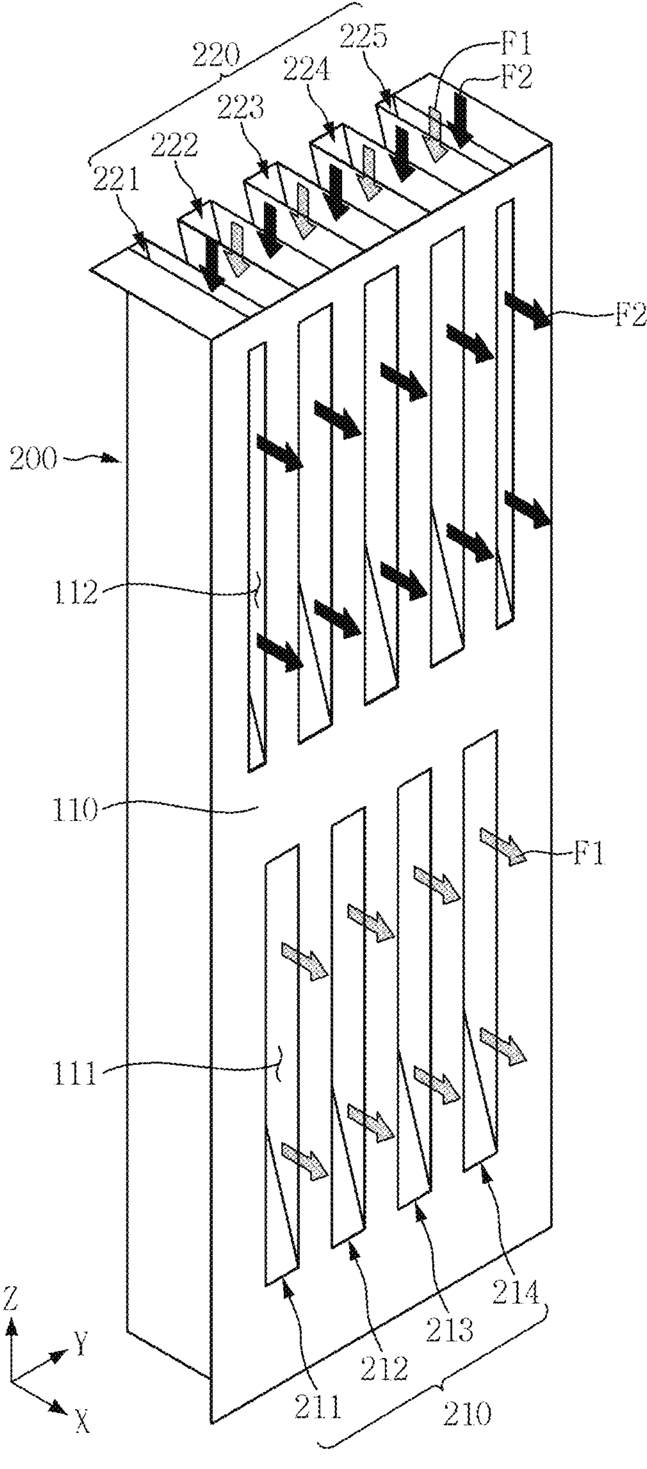
FIG. 18 is a diagram for illustrating the first wall of the test chamber in FIG. 1.

FIG. 16 is a diagram for illustrating the supply duct in FIG. 1. FIG. 17 is a diagram for illustrating the supply duct and the first wall in FIG. 1. FIG. 18 is a diagram for illustrating the first wall of the test chamber in FIG. 1. For convenience of description, following descriptions are based on differences thereof from the descriptions as set forth above using FIG. 1 to FIG. 15.

Referring to FIGS. 16 to 18, in the test apparatus according to some example embodiments, the first flow distributor 210 includes a plurality of first flow distribution structures 211, 212, 213, and 214. The plurality of first flow distribution structures 211, 212, 213 and 214 are arranged along the second direction Y. The plurality of first flow distribution structures 211, 212, 213 and 214 are spaced apart from each other along the second direction Y. The first flow distributor 210 includes a plurality of first inclined plates 216.

Each of the first flow distribution structures 211, 212, 213 and 214 includes a first inclined plate 216. Each of the first flow distribution structures 211, 212, 213, and 214 may define a first inner space IS1.

For example, the first flow distribution structure 214 may include the first inclined plate 216 and first and second sidewalls 217 and 218 respectively disposed on both opposing sides in the second direction Y of the first inclined plate 216. A width W1 in the first direction X of each of the first and second sidewalls 217 and 218 may increase as each of the first and second sidewalls 217 and 218 extends in the third direction Z. An end in the first direction X of each of the first and second sidewalls 217 and 218 may be aligned with an end in the first direction X of the supply duct 200. The first inner space IS1 may be defined by the first inclined plate 216 and the first and second sidewalls 217 and 218. A width W1 in the first direction X of the first inner space IS1 may increase as it extends in the third direction Z.

The first flow distribution structures 211, 212, 213 and 214 and the second flow distribution structures 221, 222, 223, 224 and 225 may not be aligned with each other in the third direction Z. The first inclined plates 216 and the second inclined plates 226 may not be aligned with each other in the third direction Z.

In a plan view including the first direction X and the second direction Y, the first flow distribution structures 211, 212, 213 and 214 and the second flow distribution structures 221, 222, 223, 224 and 225 may be arranged alternately with each other along the second direction Y. The first inclined plates 216 and the second inclined plates 226 may be alternately arranged with each other along the second direction Y.

In a plan view including the first direction X and the second direction Y, an area size A3 of a third area where the first flow distribution structures 211, 212, 213 and 214 are formed may be different from an area size A4 of a fourth area where the second flow distribution structures 221, 222, 223, 224 and 225 are formed. The area size A3 of the third area where the first flow distribution structures 211, 212, 213 and 214 are formed may be smaller than the area size A4 of the fourth area where the second flow distribution structures 221, 222, 223, 224 and 225 are formed.

In some example embodiments, the first wall 110 includes a plurality of first inlets 111 and a plurality of second inlets 112.

The first inlets 111 may be spaced apart from each other along the second direction Y. Each first inlet 111 may correspond to each of the first flow distribution structures 211, 212, 213, and 214. For example, each first inlet 111 may correspond to an opening of each of the first flow distribution structures 211, 212, 213, and 214 in the plan view including the second direction Y and the third direction Z. The first inlets 111 may be arranged along the second direction Y.

In a plan view including the first direction X and the second direction Y, the first inlets 111 and the second inlets 112 may be alternately arranged with each other along the second direction Y. The first inlet 111 and the second inlet 112 may not be aligned with each other in the third direction Z.

The description of the first inclined plate 216 as described using FIGS. 9 to 12 may be equally applied to the first inclined plate 216 of each of the first flow distribution structures 211, 212, 213 and 214 in FIG. 16. Shapes of the first inclined plates 216 of the first flow distribution structures 211, 212, 213, and 214 may be the same as or different from each other.

Figure 19:
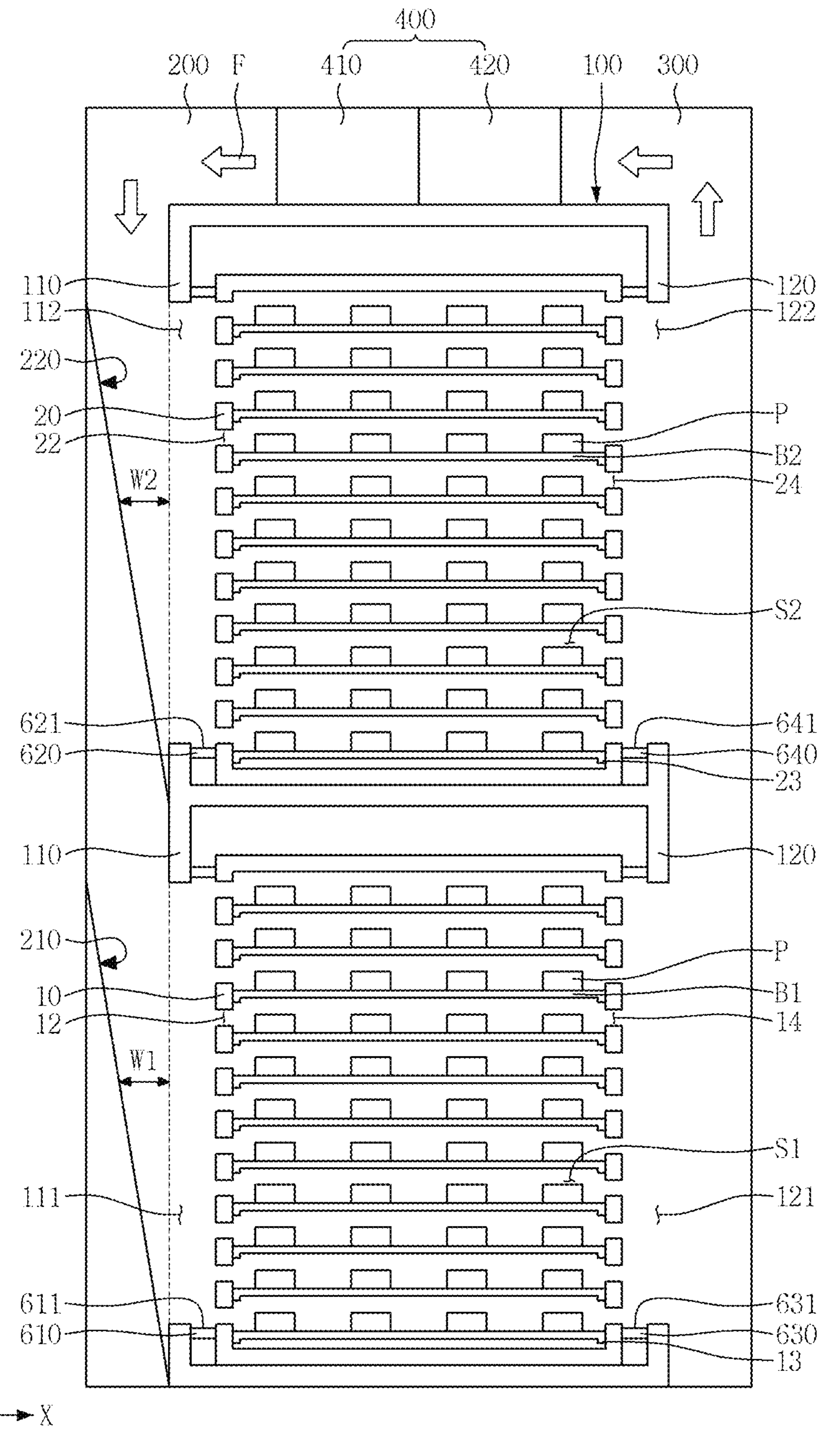
FIG. 19 and FIG. 20 are diagrams for illustrating a test apparatus according to some example embodiments.
Figure 20:
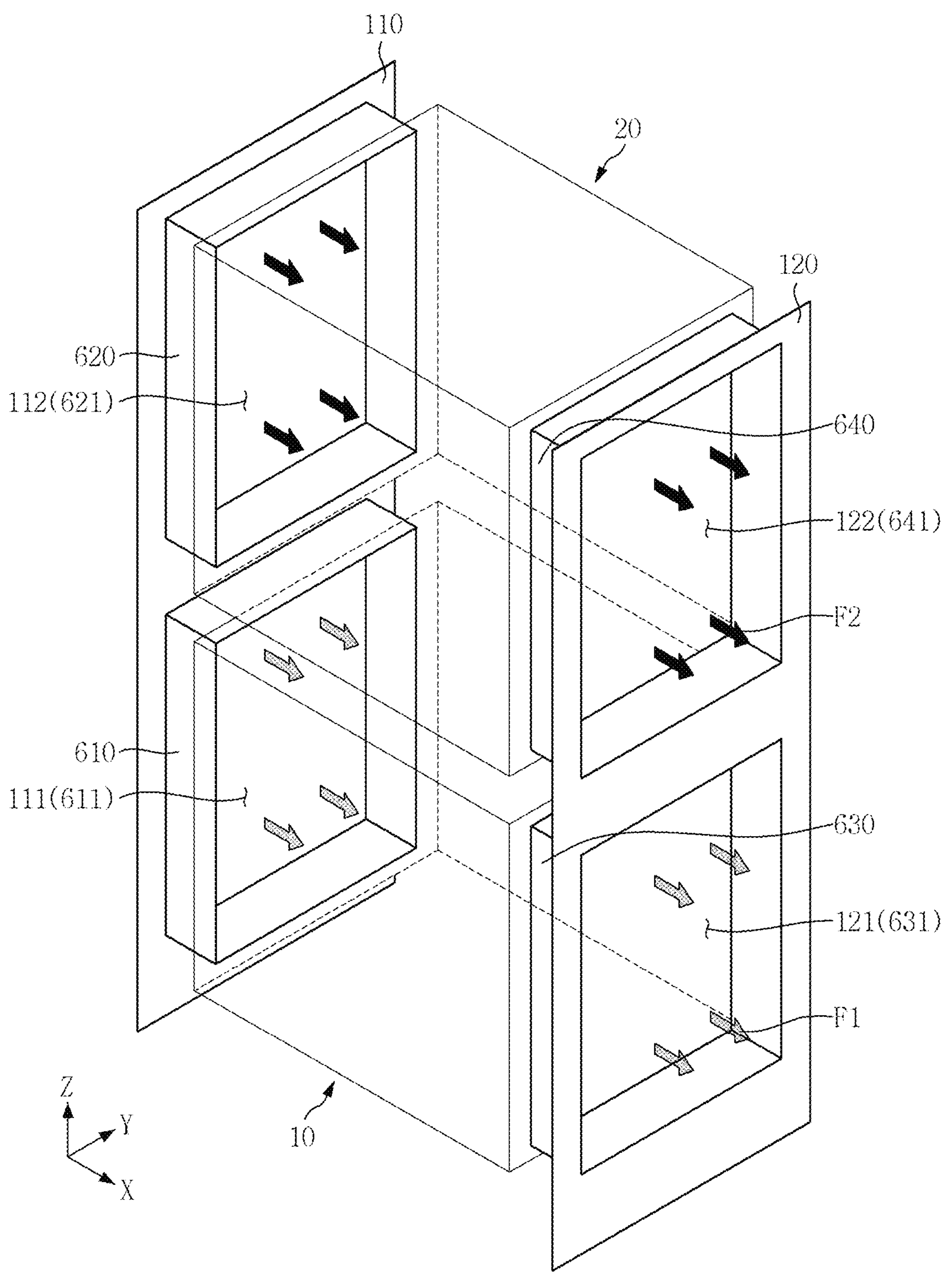

FIG. 19 and FIG. 20 are diagrams for illustrating a test apparatus according to some example embodiments. For convenience of description, following descriptions are based on differences thereof from the descriptions as set forth above using FIG. 1 to FIG. 18.

Referring to FIG. 19 and FIG. 20, the test apparatus according to some example embodiments further includes first to fourth guide structures 610, 620, 630, and 640.

The first guide structure 610 is disposed between the first wall 110 of the test chamber 100 and the first rack 10. The first guide structure 610 provides a passage between the first inlet 111 and the first rack 10. The first guide structure 610 includes at least one first opening 611. In some example embodiments, the first guide structure 610 includes the first opening 611 corresponding to the first inlet 111.

The second guide structure 620 is disposed between the first wall 110 of the test chamber 100 and the second rack 20. The second guide structure 620 provides a passage between the second inlet 112 and the second rack 20. The second guide structure 620 includes at least one second opening 621. In some example embodiments, the second guide structure 620 includes the second opening 621 corresponding to the second inlet 112.

The third guide structure 630 is disposed between the second wall 120 of the test chamber 100 and the first rack 10. The third guide structure 630 provides a passage between the first discharge hole 121 and the first rack 10. The third guide structure 630 includes at least one third opening 631. In some example embodiments, the third guide structure 630 includes the third opening 631 corresponding to the first discharge hole 121.

The fourth guide structure 640 is disposed between the second wall 120 of the test chamber 100 and the second rack 20. The fourth guide structure 640 provides a passage between the second discharge hole 122 and the second rack 20. The fourth guide structure 640 includes at least one fourth opening 641. In some example embodiments, the fourth guide structure 640 includes the fourth opening 641 corresponding to the second discharge hole 122.

The first to fourth guide structures 610, 620, 630, and 640 may prevent the air from being supplied to or discharged from a non-storage space in the test chamber 100 in which the burn in boards B1 and B2 are not stored, such as a space on top of the first rack 10, a space under the second rack 20, or a space between the first rack 10 and the second rack 20. In other words, the air may be prevented from diffusing into a space other than the first and second slots S1 and S2, such that control precision on the air F within the test chamber 100 may be increased and inspection efficiency may be improved.

The first and second guide structures 610 and 620 may be disposed on the first wall 110 of the test chamber 100 of FIGS. 1 to 18, and the third and fourth guide structures 630 and 640 may be disposed on the second wall 120 of the test chamber 100 of FIGS. 1 to 18.

Figure 21:
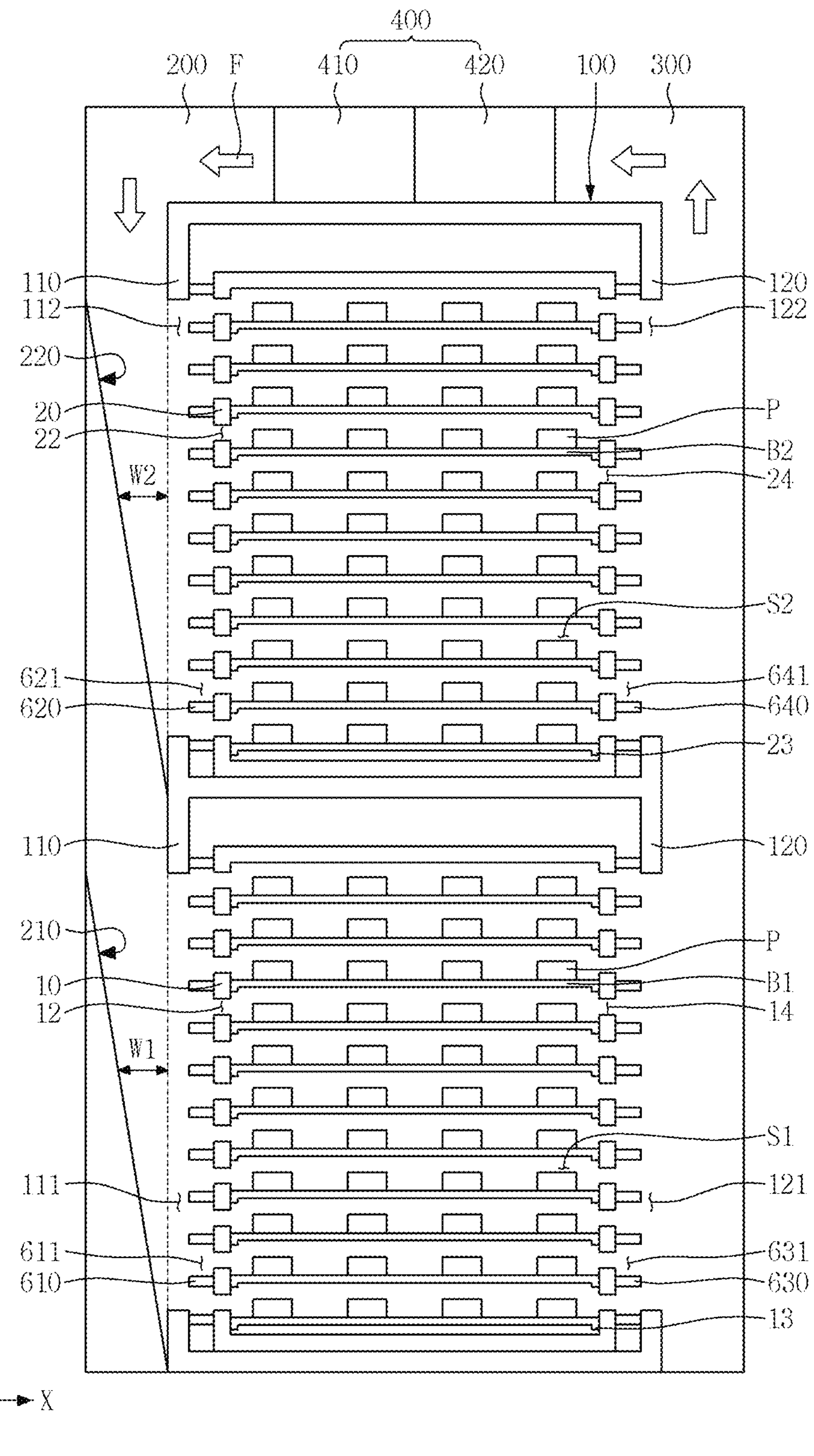
FIG. 21 and FIG. 22 are diagrams for illustrating a test apparatus according to some example embodiments.
Figure 22:
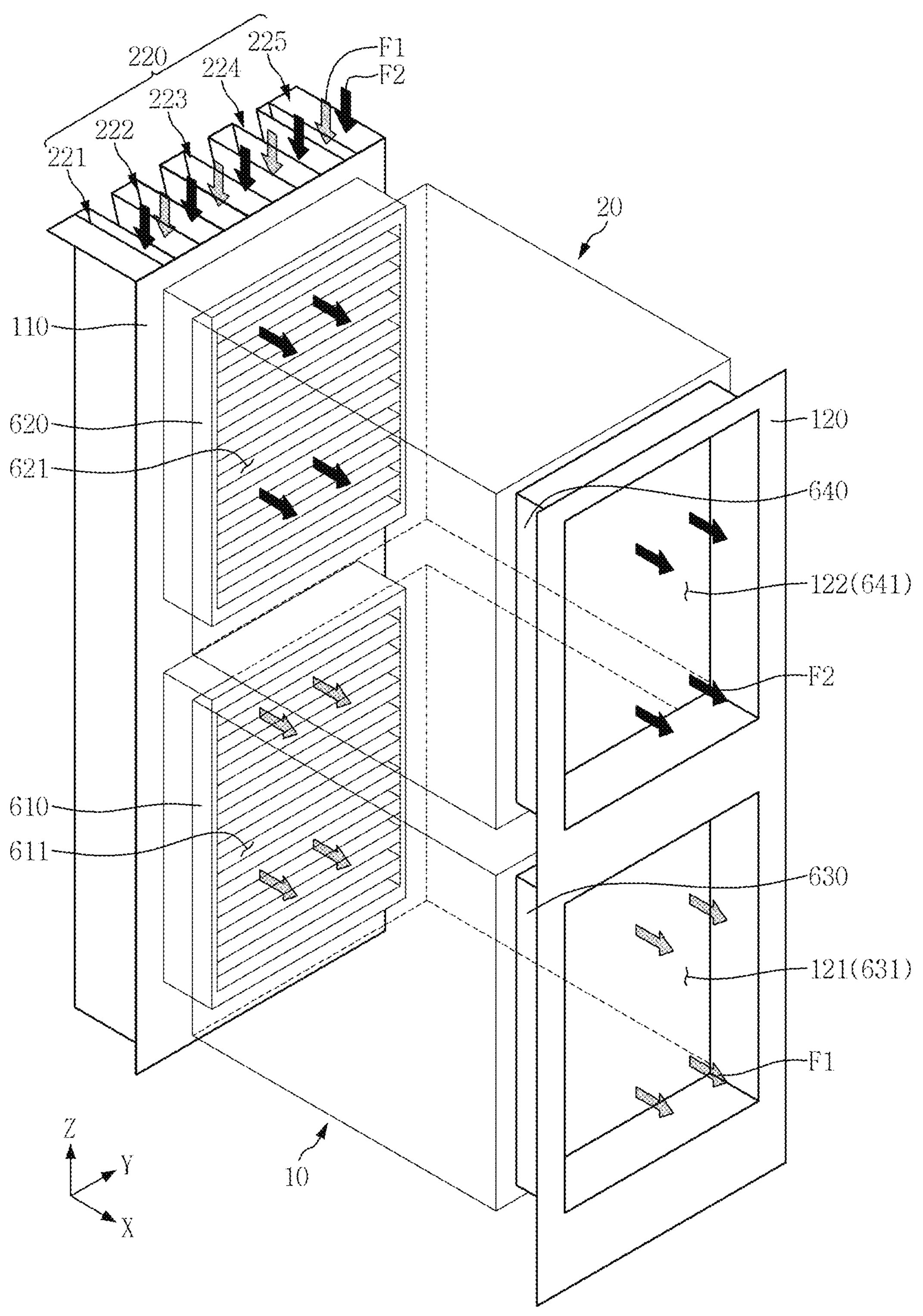
Figure 23:
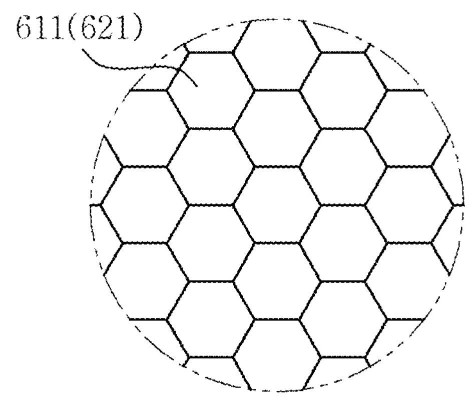
FIG. 23 is a diagram for illustrating first and second guide structures in FIG. 21 and FIG. 22.

FIG. 21 and FIG. 22 are diagrams for illustrating a test apparatus according to some example embodiments. FIG. 23 is a diagram for illustrating the first and second guide structures in FIG. 21 and FIG. 22. For convenience of description, following descriptions are based on differences thereof from the descriptions as set forth above using FIG. 1 to FIG. 20.

Referring to FIGS. 21 to 23, in the test apparatus according to some example embodiments, the first guide structure 610 includes a plurality of first openings 611, and the second guide structure 620 includes a plurality of second openings 621.

Referring to FIG. 21 and FIG. 22, in the test apparatus according to some example embodiments, the plurality of first openings 611 are arranged so as to be spaced apart from each other in the third direction Z. The first opening 611 may extend in the second direction Y. Each first opening 611 corresponds to the first slot S1. The first guide structure 610 extends in the second direction Y and includes a plurality of first supports arranged to be spaced apart from each other in the third direction Z. Each first opening 611 may be defined by the first supports adjacent to each other in the third direction Z. Each of the first supports may be formed at a position corresponding to a position of the first burn in board B1. In some examples, each of or at least one of the second guide structures 620 and the plurality of second openings 621 may be arranged vertically and/or diagonally; example embodiments are not limited thereto.

The plurality of second openings 621 are arranged so as to be spaced apart from each other in the third direction Z. The second opening 621 may extend in the second direction Y. Each second opening 621 corresponds to the second slot S2. The second guide structure 620 extends in the second direction Y and includes a plurality of second supports arranged to be spaced apart from each other in the third direction Z. Each second opening 621 may be defined by the second supports adjacent to each other in the third direction Z. Each of the second supports may be formed at a position corresponding to a position of the second burn in board B2.

The third guide structure 630 includes a third opening 631 corresponding to the first discharge hole 121, and the fourth guide structure 640 includes a fourth opening 641 corresponding to the second discharge hole 122.

The first and second guide structures 610 and 620 may be disposed on the first wall 110 of the test chamber 100 of FIGS. 1 to 18, and the third and fourth guide structures 630 and 640 may be disposed on the second wall 120 of the test chamber 100 of FIGS. 1 to 18.

Referring to FIG. 23, in the test apparatus according to some example embodiments, the first openings 611 and/or the second openings 621 of the first wall 110 may be arranged in a honeycomb structure. For example, the first openings 611 may be arranged in a honeycomb structure, and the second openings 621 may be arranged in a honeycomb structure. Each of the first opening 611 and the second opening 621 may have a hexagonal shape. The first openings 611 may be arranged in the first direction X and the second direction Y. The second openings 621 may be arranged in the first direction X and the second direction Y.

The first and second guide structures 610 and 620 may be disposed on the first wall 110 of the test chamber 100 of FIGS. 1 to 18, and the third and fourth guide structures 630 and 640 may be disposed on the second wall 120 of the test chamber 100 of FIGS. 1 to 18.

Although various example embodiments have been described with reference to the accompanying drawings, the present disclosure is not limited to the above embodiments, but may be implemented in various different forms. A person skilled in the art may appreciate that the present disclosure may be practiced in other concrete forms without changing the technical spirit and/or essential characteristics of inventive concepts. Therefore, it should be appreciated that the embodiments as described above is not restrictive but illustrative in all respects. Furthermore, example embodiments are not necessarily mutually exclusive. For example, some example embodiments may include one or more features described with reference to one or more figures, and may also include one or more other features described with reference to one or more other figures.

What is claimed is:

1. A test apparatus comprising:

a test chamber;

a first rack within the test chamber and configured to support a plurality of first burn in boards stacked in a first direction;

a second rack within the test chamber and on top of the first rack, and configured to support a plurality of second burn in boards stacked in the first direction; and a supply duct on a first wall in a second direction of the test chamber, wherein the supply duct includes a first flow distributor corresponding to the first rack and a second flow distributor corresponding to the second rack, wherein the first flow distributor includes at least one first inclined plate configured to at least partly overlap the plurality of first burn in boards in the second direction, and the at least one first inclined plate extending in an inclined manner toward a bottom of the first rack in an inner space of the supply duct, and the second flow distributor includes at least one second inclined plate spaced apart from the at least one first inclined plate in the first direction, the at least one second inclined plate being configured to at least partly overlap the plurality of second burn in boards in the second direction, and the at least one second inclined plate extending in an inclined manner toward a bottom of the second rack in an inner space of the supply duct.

2. The test apparatus of claim 1, wherein in a plan view of the apparatus including the second direction and a third direction, an area size of a first area where the at least one first inclined plate is arranged is different from an area size of a second area where the at least one second inclined plate is arranged, and the third direction intersecting the first direction and the second direction.

3. The test apparatus of claim 2, wherein the area size of the first area is smaller than the area size of the second area.

4. The test apparatus of claim 1, wherein the second flow distributor includes a plurality of second inclined plates spaced apart from each other in a third direction intersecting the first direction and the second direction.

5. The test apparatus of claim 4, wherein the first flow distributor includes a plurality of first inclined plates spaced apart from each other in the third direction, and the plurality of second inclined plates are not aligned with the plurality of first inclined plates in the first direction, respectively.

6. The test apparatus of claim 1, wherein at least one of the at least one first inclined plate or the at least one second inclined plate has a convex shape in the first direction.

7. The test apparatus of claim 1, wherein at least one of the at least one first inclined plate or the at least one second inclined plate has a concave shape in the first direction.

8. The test apparatus of claim 1, wherein at least one of the at least one first inclined plate or the at least one second inclined plate includes a first sub-inclined plate having a first inclination and a second sub-inclined plate having a second inclination different from the first inclination.

9. The test apparatus of claim 1, wherein the first wall of the test chamber defines at least one first inlet and at least one second inlet, each of the at least one first inlet corresponds to each of the at least one first inclined plate, and each of the at least one second inlet corresponds to each of the at least one second inclined plate.

10. The test apparatus of claim 1, wherein the first wall of the test chamber defines a plurality of first inlets and a plurality of second inlets, each of the plurality of first inlets corresponds to a space between the first burn in boards adjacent to each other in the first direction, and each of the plurality of second inlets corresponds to a space between the second burn in boards adjacent to each other in the first direction.

11. The test apparatus of claim 1, wherein the first wall of the test chamber defines a plurality of inlets arranged in a honeycomb structure.

12. A test apparatus comprising:

a test chamber;

a first rack within the test chamber and configured to support a plurality of first burn in boards stacked in a first direction;

a second rack within the test chamber and on top of the first rack, and configured to support a plurality of second burn in boards stacked in the first direction; and a supply duct on a first wall in a second direction of the test chamber, wherein the supply duct includes a first flow distributor corresponding to the first rack and a second flow distributor corresponding to the second rack, wherein the first flow distributor includes at least one first flow distribution structure, each first flow distribution structure defining a first inner space, and a width in the second direction of the first inner space increases as the first inner space extends along the first direction, the second flow distributor includes a plurality of second flow distribution structures arranged along a third direction intersecting the first direction and the second direction, and each of the plurality of second flow distribution structures defines a second inner space, and a width in the second direction of the second inner space increases as the second inner space extends along the first direction.

13. The test apparatus of claim 12, wherein in a plan view of the apparatus including the second direction and the third direction, an area size of a first area where the plurality of the second flow distribution structures are arranged is different from an area size of a second area where the plurality of the second flow distribution structures are not formed.

14. The test apparatus of claim 12, wherein the at least one first flow distribution structure includes a plurality of first flow distribution structures, and the plurality of first flow distribution structures are arranged along the third direction.

15. The test apparatus of claim 14, wherein in a plan view of the apparatus including the second direction and the third direction, the plurality of first flow distribution structures and the plurality of second flow distribution structure are alternately arranged with each other along the third direction.

16. The test apparatus of claim 12, wherein the at least one first flow distribution structure includes one first flow distribution structure, the first wall of the test chamber defines a first inlet and a plurality of second inlets, the first inlet is in communication with the first inner space, each of the plurality of second inlets is in communication with the second inner space of each of the plurality of second flow distribution structures.

17. The test apparatus of claim 16, further comprising:

a first guide structure between the first wall and the first rack and providing a passage between the first inlet and the first rack; and a second guide structure between the first wall and the second rack and providing a passage between the plurality of second inlets and the second rack.

18. The test apparatus of claim 17, wherein the first rack includes a plurality of first slots, and each of the plurality of first slots are configured to accommodate therein each of the plurality of first burn in boards, the second rack includes a plurality of second slots, and each of the plurality of second slots are configured to accommodate therein each of the plurality of second burn in boards, the first guide structure includes a plurality of first openings, and each of the plurality of first openings corresponds to each of the plurality of first slots, and the second guide structure includes a plurality of second openings, and each of the plurality of second openings corresponds to each of the plurality of second slots.

19. A test apparatus comprising:

a test chamber;

a first rack within the test chamber and configured to support a plurality of first burn in boards stacked in a first direction;

a second rack within the test chamber and on top of the first rack, and configured to support a plurality of second burn in boards stacked in the first direction; and a first wall of the test chamber extending in a second direction and defining a plurality of inlets;

a supply duct on the first wall of the test chamber, wherein the supply duct includes a first flow distributor corresponding to the first rack and a second flow distributor corresponding to the second rack; and a second wall of the test chamber extending in the second direction and defining a first discharge hole corresponding to the first rack and a second discharge hole corresponding to the second rack, wherein the first flow distributor includes at least one first inclined plate, and a distance between the first inclined plate and the first wall increases as the first inclined plate extends along the first direction, the second flow distributor includes a plurality of second inclined plates spaced apart from each other along a third direction intersecting the first direction and the second direction, and a distance between each of the plurality of second inclined plates and the first wall increases as each of the plurality of second inclined plates extends along the first direction.

20. The test apparatus of claim 19, further comprising:

a first guide structure between the second wall and the first rack and providing a passage between the first discharge hole and the first rack; and a second guide structure between the second wall and the second rack and providing a passage between the second discharge hole and the second rack.

* * * * *